(12) United States Patent
Patil et al.

(10) Patent No.: US 11,584,643 B2
(45) Date of Patent: Feb. 21, 2023

(54) MICRO-ELECTROMECHANICAL (MEM) POWER RELAY

(71) Applicant: Massachusetts Institute of Technology, Cambridge, MA (US)

(72) Inventors: Prashant Patil, Cambridge, MA (US); Neil Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 151 days.

(21) Appl. No.: 17/098,107

(22) Filed: Nov. 13, 2020

(65) Prior Publication Data
US 2021/0139322 A1 May 13, 2021

Related U.S. Application Data

(60) Provisional application No. 62/934,770, filed on Nov. 13, 2019.

(51) Int. Cl.
*B81C 3/00* (2006.01)
*B81C 1/00* (2006.01)

(52) U.S. Cl.
CPC .......... *B81C 3/004* (2013.01); *B81C 1/00166* (2013.01); *B81C 2201/0101* (2013.01); *B81C 2203/051* (2013.01)

(58) Field of Classification Search
CPC ................................................... B81B 3/0086
See application file for complete search history.

(56) References Cited

U.S. PATENT DOCUMENTS 6,094,116 A    7/2000  Tai et al.
9,185,820 B2 * 11/2015  Rogers .................. H05K 3/467

2002/0163408 A1* 11/2002  Fujii .................. H01H 59/0009
                                                            335/2
2008/0297320 A1* 12/2008  Kawae ............... G06K 19/0701
                                                            455/269
2018/0068214 A1*  3/2018  Jesme ............... G06K 19/07754
2019/0246501 A1*  8/2019  Morianz ............. H01L 23/5389
2020/0315429 A1* 10/2020  Russo .................... A61B 34/30

FOREIGN PATENT DOCUMENTS

DE      4205029      2/1993
EP      1555713      7/2005

OTHER PUBLICATIONS

International Search Report for Application PCT/US 2020/060573, dated Apr. 1, 2021, 3 Pages.
Written Opinion of the International Searching Authority for Application PCT/US 2020/060573, dated Apr. 1, 2021, 5 Pages.

* cited by examiner

*Primary Examiner* — Moazzam Hossain
(74) *Attorney, Agent, or Firm* — Dunlap Bennett & Ludwig, PLLC

(57) ABSTRACT

A micro-electromechanical (MEM) relay and its fabrication process. The MEM relay includes a movable actuator electrode anchored to a substrate with two cantilever beams. Below the actuator electrode, there are three fixed electrodes. These three electrodes are the gate, the input, and the output contacts. The square base of the actuator electrode, and the square gate electrode below it, form an electrostatic parallel-plate actuator. When a voltage is applied between the actuator electrode and the gate electrode, the actuator electrode is pulled-down due to electrostatic attraction closing the relay. When the voltage is removed, the cantilever beams act as springs opening the relay.

10 Claims, 15 Drawing Sheets

MICRO-ELECTROMECHANICAL (MEM) POWER RELAY

This application is related to, and claims priority to, U.S. Provisional Patent Application No. 62/934,770 filed Nov. 13, 2019. Application 62/934,770 is hereby incorporated by reference in its entirety.

BACKGROUND

Field of the Invention

The present invention relates generally to relays and more particularly to a micro-electromechanical (MEM) power relay and its fabrication process.

Description of the Problem Solved

Many uses have been found for micro parts, especially micro-electromechanical parts. It is very difficult to produce such MEM parts since some parts of the devices are electrical, while other parts of the devices are mechanical. In the case of a relay, an electrical signal of some sort must move a mechanical arm. Classical MEMS relays are fabricated using microfabrication processes developed for silicon integrated circuits. In that process, silicon is etched to create relay micro-structures, and a thin layer of metal is deposited on silicon micro-structures to create electrical contacts. The small thickness of the metal layer limits the current carrying capacity of the relay to low current. Thus, the application of these relays has been limited to low current applications such as RF MEMS relay used for switching RF signals. It would be extremely advantageous to have a MEMS relay (also known as MEMS power relay) with thick metal electrodes, thereby drastically increasing the current carrying capacity.

SUMMARY OF THE INVENTION

The design of the MEM relay of the present invention works on the principle of electrostatic attraction and includes a movable actuator electrode anchored to a substrate with two cantilever beams. There are three fixed electrodes below the actuator electrode. These three electrodes are a gate, an input, and an output. The square base of the actuator electrode, and the square gate electrode below it, form an electrostatic parallel-plate actuator. When a voltage is applied between the actuator electrode and the gate electrode, the actuator electrode is pulled-downward due to electrostatic attraction. The actuator electrode has a contact bar that completes the contact path between the input and output contacts, thus closing the relay.

DESCRIPTION OF THE FIGURES

Several illustrations are now presented to aid in understanding features of the present invention.

FIGS. 9A-9B show SEM images of the operation of MEM relay. (A) The small air-gap between the movable contact and input and output contact when the relay is off, and (B) the formation of electrical contact between the movable electrode and input and output contact when the relay is turned on.

Several drawings and illustrations have been presented to aid in understanding the present invention. The scope of the present invention is not limited by what is shown in the figures.

DESCRIPTION OF THE PREFERRED EMBODIMENTS

MEM Relay

The present invention relates to a micro-electromechanical (MEM) relay and its fabrication process. An embodiment of the MEM relay is shown in FIG. 1. The relay includes a movable actuator electrode anchored to a substrate with two cantilever beams. Below the actuator electrode are three fixed electrodes. These three electrodes are the gate, the input contact, and the output contact. The gate electrode is conformally coated with ten micrometers thick perylene coating which acts as dielectric insulation between the gate electrode and movable actuator. The square base of the actuator electrode, and the square gate electrode below it form an electrostatic parallel-plate actuator. When a voltage is applied between the actuator electrode and the gate electrode, the actuator electrode is pulled downward due to electrostatic attraction from the resulting electric field. Very little current flows in the gate circuit, since the parallel-plate actuator is in reality a very small capacitor. Once, the capacitor is charged, almost no current can flow (only extremely small leakage currents). When the gate voltage is removed, a small amount of current flows out of the actuator as the capacitance discharges and the input/output circuit is opened by the two cantilever springs.

A moving electrical contact bar is attached to the actuator electrode via 12 µm thick dielectric layer as shown in the inset of FIG. 1. FIG. 2 shows a bottom schematic view of the actuator electrode, and displays the movable contact bar as well as the dielectric layer.

Figure 1A:
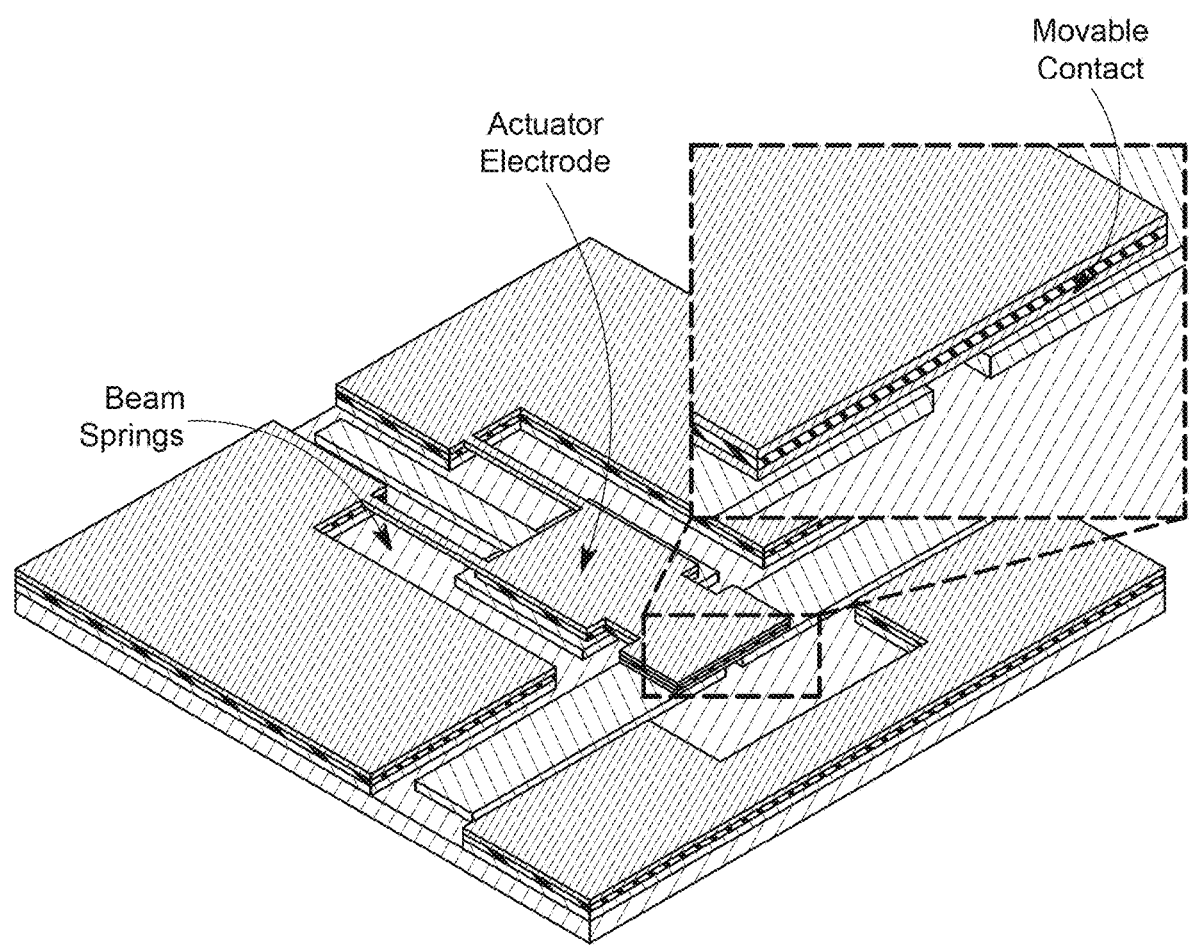
FIGS. 1A-1B show a schematic diagram of the micro-electromechanical (MEM) relay. It includes two layers: (a) a top layer containing the actuator electrode, beam springs, and a movable contact and (b) a bottom substrate layer containing gate, input, and output electrodes.
Figure 1B:
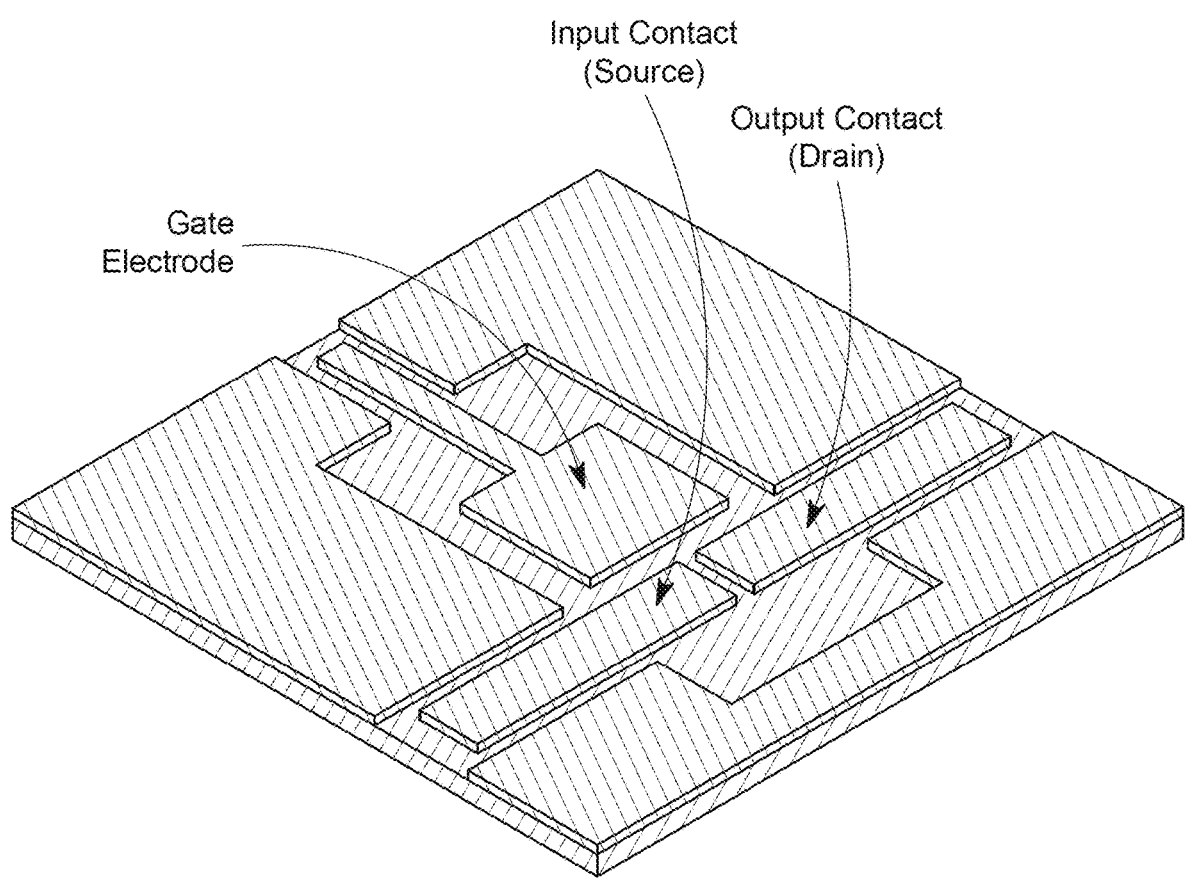
Figure 2:
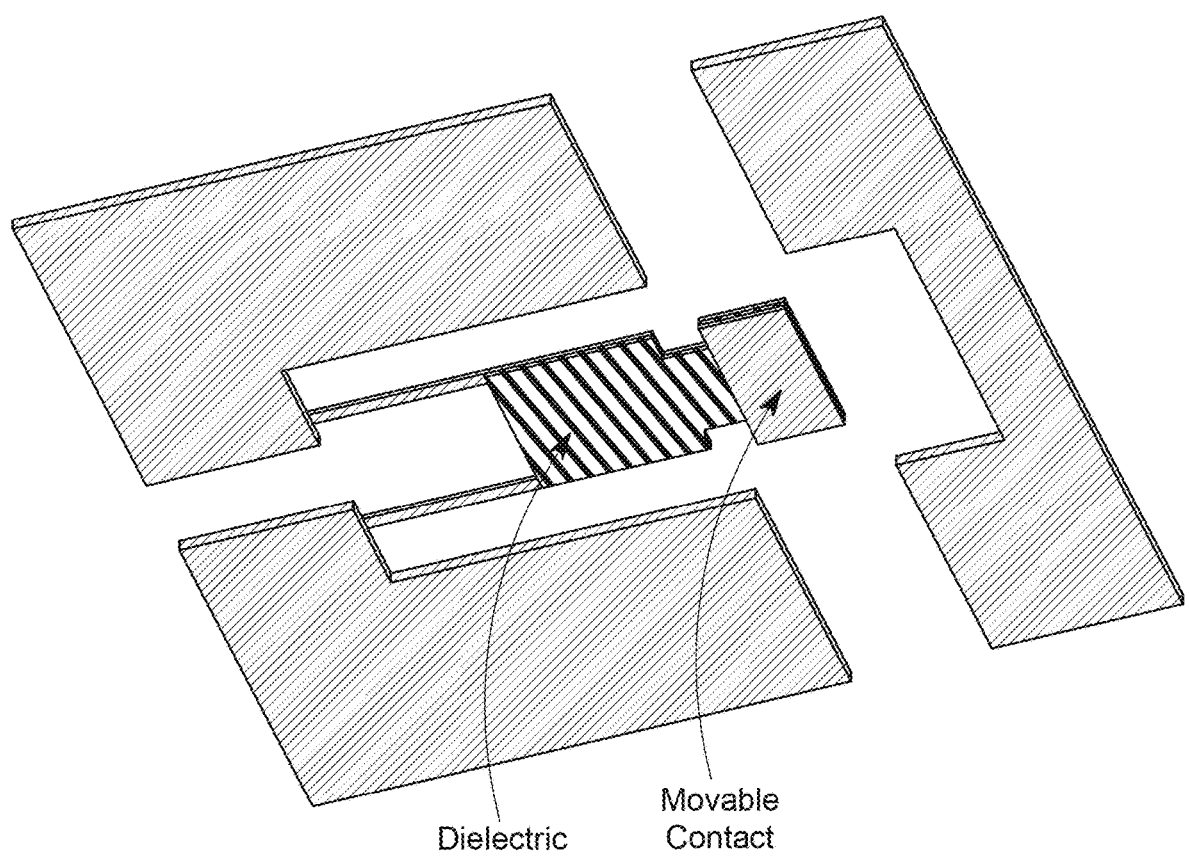
FIG. 2 is a schematic diagram of the bottom of the actuator electrode showing the movable contact and the insulating polyimide layer. The polyimide layer is used as an insulating layer between the actuator electrode and movable contact and between the actuator electrode and the gate electrode.

As can be seen in FIGS. 1A and 1B, the relay includes two layers: (a) a top layer containing actuator electrode, beam springs, and movable contact (inset) and (b) a bottom substrate layer containing the gate, input, and output electrodes The movable contact, input contact, and output contact are separated by a small air gap, as shown in the inset of FIG. 1A. The input and output contacts are fixed while the movable contact is free to move. When a voltage is applied between the actuator electrode and the gate electrode greater than a particular threshold voltage (determined by the dimensions of the device and the size of the springs), the actuator electrode is pulled-down towards the gate. As a result, the movable contact makes an electrical connection simultaneously with input and output contacts, completing the electrical connection between the input and output electrode and closing the relay. When the voltage is removed, the actuator electrode returns to its original position due to the restoring force of the beam springs opening the relay.

Figure 3:
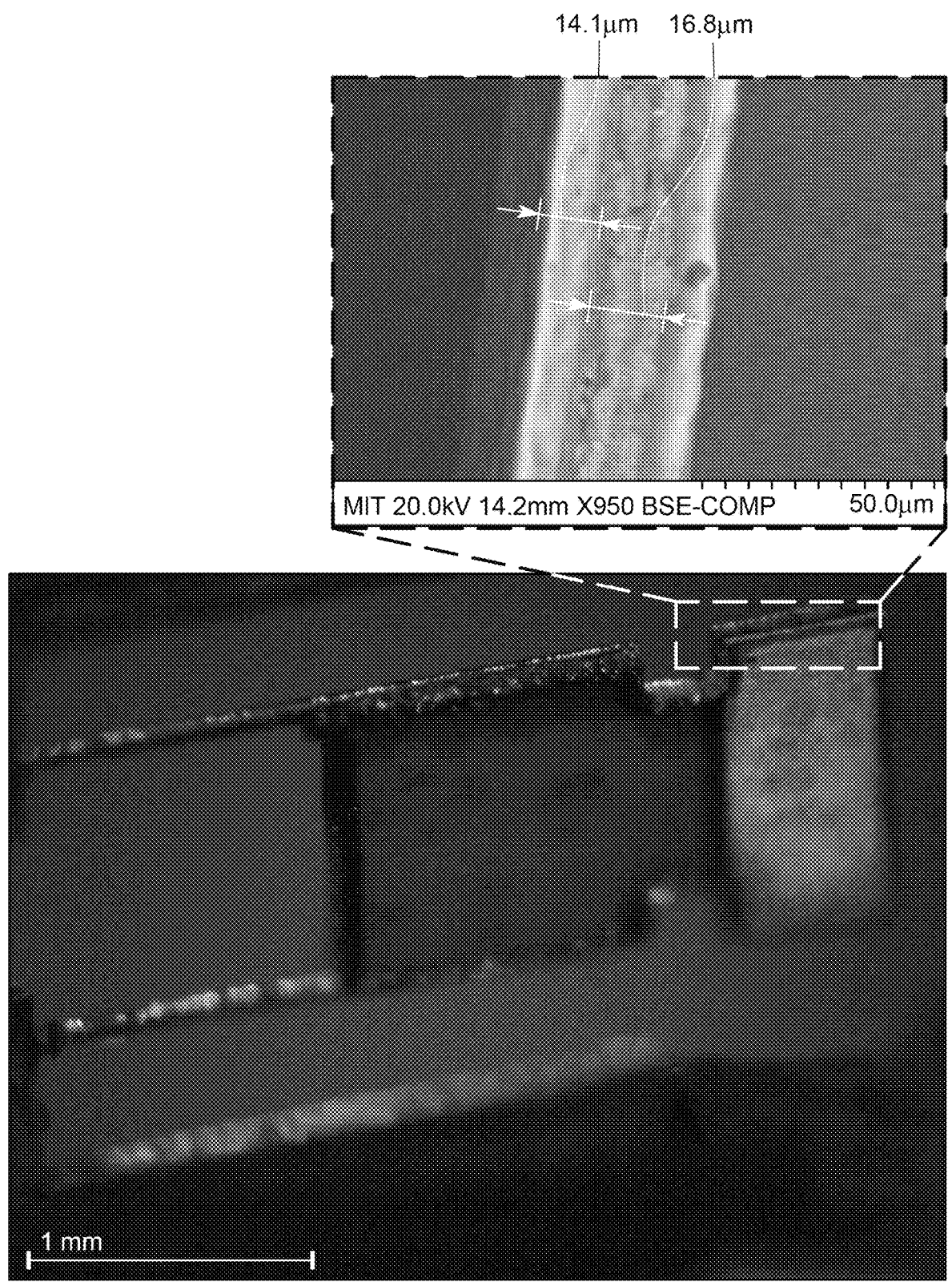
FIG. 3 is an optical microscope image of the fabricated actuator electrode showing the polyimide insulating layer and the movable contact. The inset shows the copper-polyimide-copper laminate structure.

FIG. 3 shows the actuator electrode, cantilever beam springs and contact bar. As can be seen from FIG. 3, a typical size for the contact bar in this embodiment is approximately 1 mm.

MEM Relay Fabrication Process

The fabrication of the MEM relay includes three steps. First is the fabrication of the actuator electrode which contains one electrode of the parallel-plate actuator and movable contact. Second is the fabrication of the substrate layer which contains the gate, the input and the output electrode. Third is the stack-assembly of actuator electrode and substrate layer to make the MEM relay.

The actuator electrode itself includes three layers. The top layer is an approximately 18 µm thick copper sheet patterned to form two beam springs, an actuator-plate, and a post for movable contact. The middle layer is an approximately 12 µm thick polyimide layer and covers the actuator-plate and post for movable contact. The middle layer is used to isolate the actuator electrode from the gate electrode and movable contact. The bottom layer is an approximately 18 µm thick copper layer consisting of a movable contact (See FIG. 2). The actuator electrode is fabricated by first laser micromachining individual layers and using electro-deburring process to remove the burrs produced during the laser micromachining process and stack-assembling and bonding. It is essential to remove the burrs as they can act as source of field emitted electron, thereby, causing electrical short between the actuator electrode and gate electrode. FIG. 3 shows the fabricated actuator electrode and the inset shows (actuator electrode)-polyimide-(movable contact) laminate structure. FIG. 3 is an optical microscope image of the fabricated actuator electrode showing the polyimide insulating layer and movable contact. The inset shows the copper-polyimide-copper laminate structure.

Figure 4:
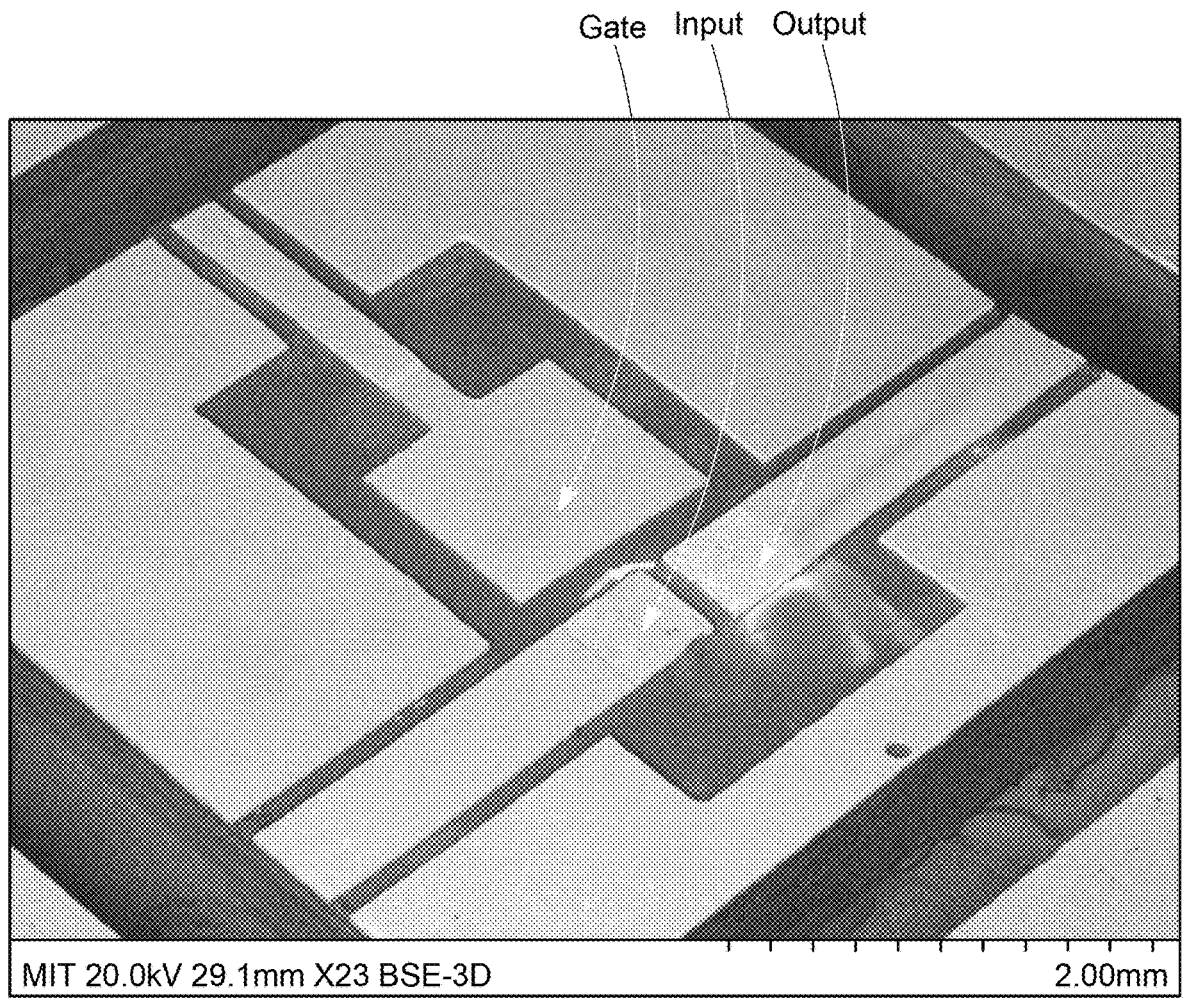
FIG. 4 is a scanning electron microscope (SEM) image of the fabricated substrate layer showing the gate, the input, and the output electrodes.

The substrate layer is fabricated from copper-clad printed circuit board (PCB) material. The copper layer is approximately 35 µm thick, and the FR4 support layer is approximately 0.7 mm thick. The gate, input, and output electrodes are patterned by micro-milling the top copper layer using a 125 µm diameter end-mill. The minimum achievable feature size is 127 µm which is sufficient for this application. The micro-milling process results in micro-burrs at the edges of the electrode. These burrs are removed using an electro-deburring process. Lastly, four alignment holes are drilled using 1.55 mm drill bits. The gate electrode is coated with conformal parylene dielectric coating. The fabricated substrate layer is shown in FIG. 4. FIG. 4 is a Scanning Electron Microscope (SEM) image of the fabricated substrate layer showing gate, input, and output electrodes. The substrate layer can also be fabricated by laser machining 35 µm copper layer to form gate, input, output electrodes and laminating it over 100 µm ceramic insulating layer.

Figure 5A:
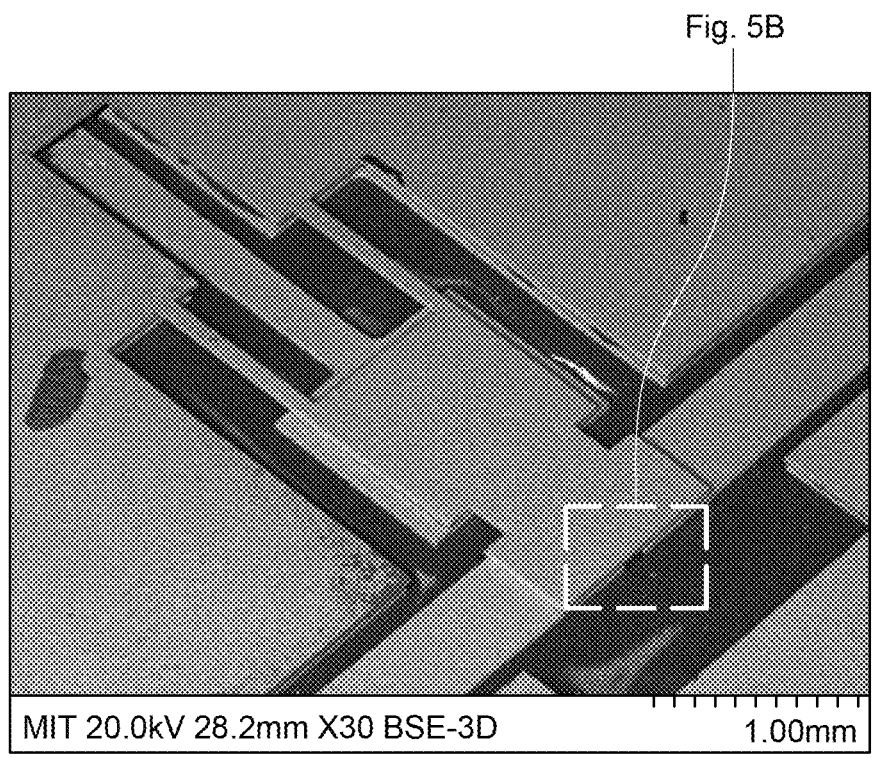
FIGS. 5A-5B show the SEM image of the assembled MEM relay. The inset shows the distance between the movable contact and input and output contacts, which is 27.4 μm.
Figure 5B:
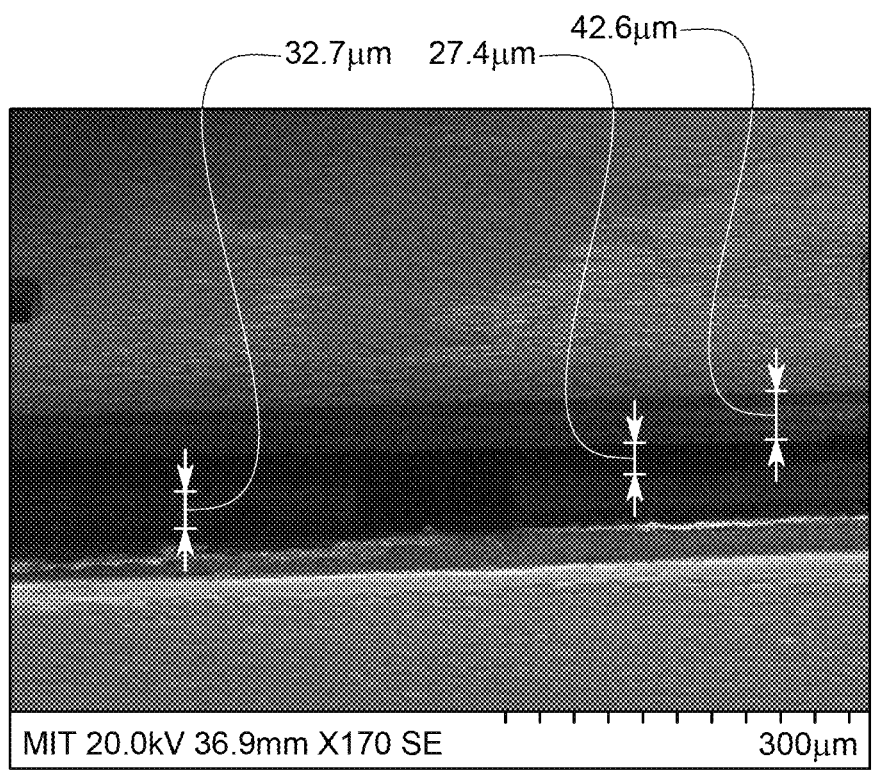

Finally, the actuator electrode is aligned and bonded over the substrate layer using a multi-lamina assembly process. For alignment, dowel pins of diameter approximately 1.5 mm are used which provide sufficient alignment accuracy required for a MEM relay. An approximately 25 µm thick adhesive layer is used to bond the two layers and create the desired gap between the movable contact and the input/output contacts. FIGS. 5A-5B show a SEM image of the assembled MEM relay. The inset shows the distance between the movable contact and input and output contacts which is 27.4 µm which is close to the thickness of the adhesive layer.

Figure 6:
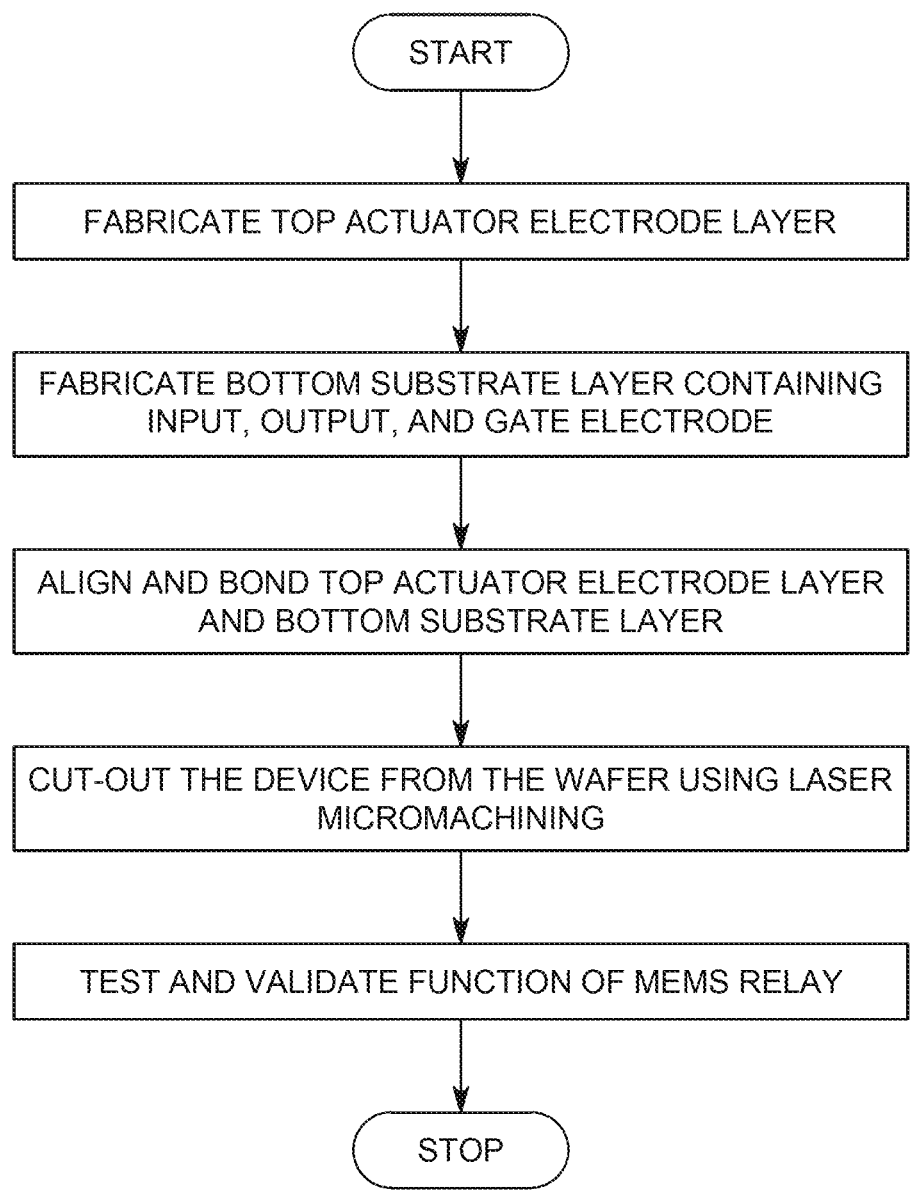
FIG. 6 is a flow chart of the general fabrication process.
Figure 7:
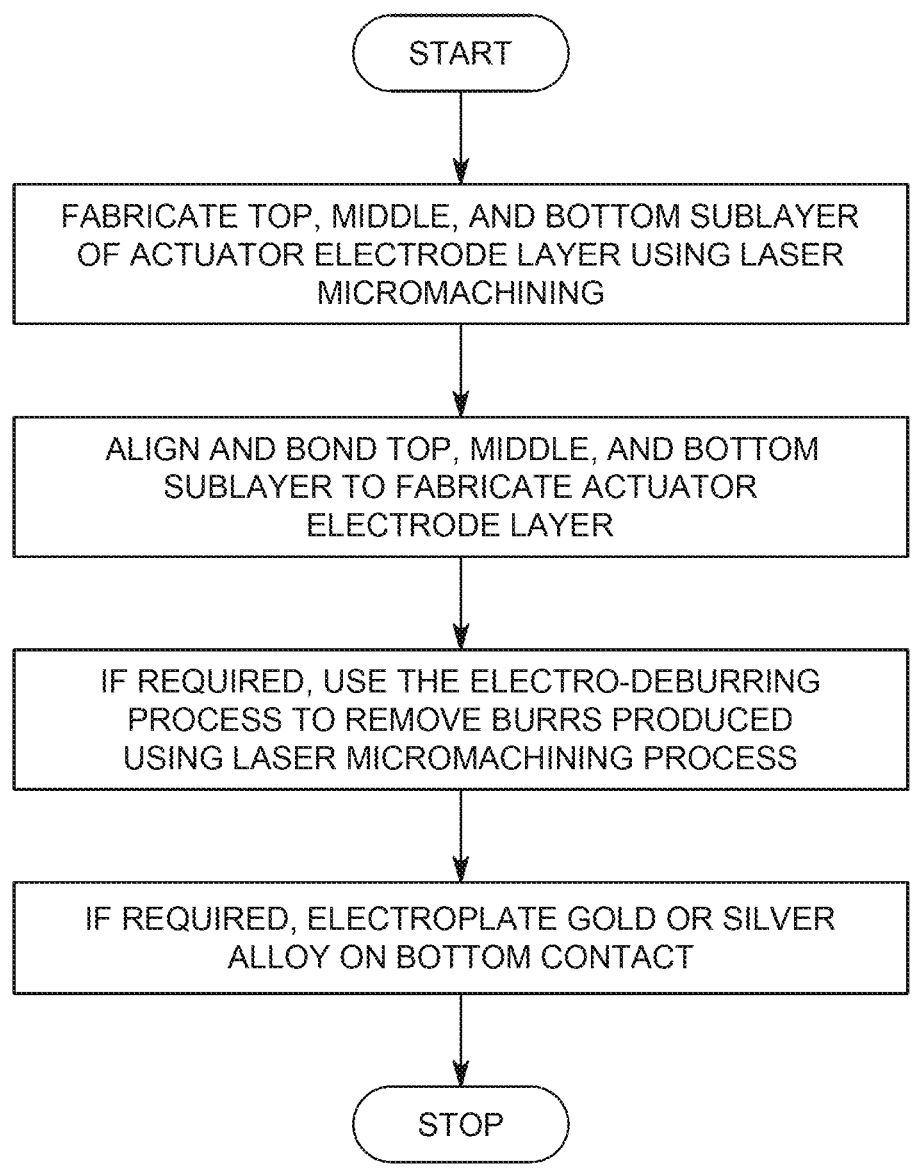
FIG. 7 is a flow chart of fabrication of the top actuator electrode.

A flowchart of the overall MEM relay fabrication process is shown in FIG. 6, while a flowchart of the fabrication of the top actuator electrode is shown in FIG. 7.

MEM Relay Characterization

The fabricated MEM relay of the present invention can be tested by measuring the current between the input and output electrodes (i.e., the source-drain current, $I_D$) at various gate voltages $V_G$. An HP4156 semiconductor parameter analyzer, equipped with four source-measure units (SMU), can be used to take the measurement. The actuator electrode is connected to electrical ground, and a voltage $V_G$ is applied to the gate electrode. For measuring the source-drain current $I_D$, the input electrode (source) is connected to ground, and a voltage $V_{DS}$ is applied to the output (drain) electrode.

Figure 8:
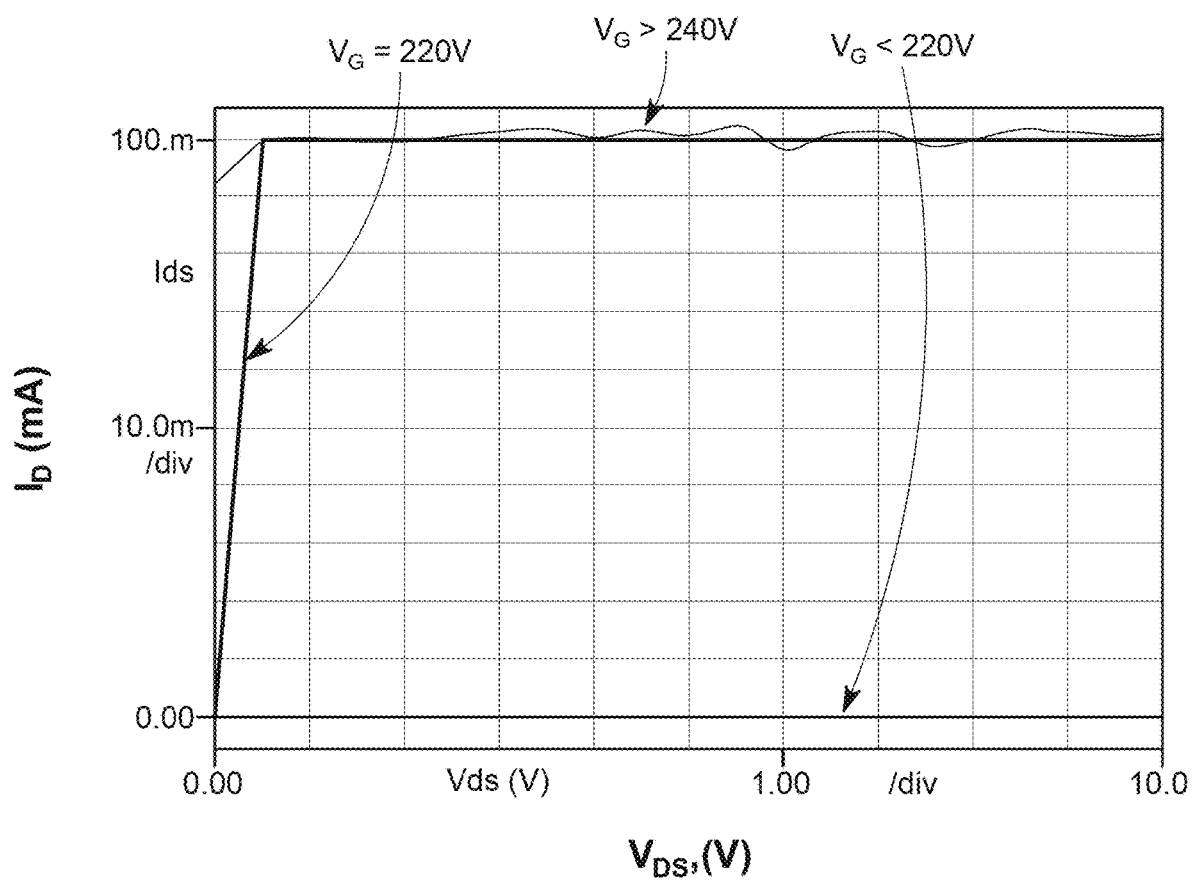
FIG. 8 is a graph of the source-drain current-voltage ($I_D$ vs. $V_{DS}$) measurement at various VG gate voltages.

FIG. 8 shows $I_D$ vs. $V_{DS}$ measurement at different gate voltages $V_G$. The $V_{DS}$ voltage is varied from 0V to 10V, and the corresponding current $I_D$ is measured and plotted. For a gate voltage $V_G$ less than 220V, there is an air gap between the movable contact and input/output contact (FIG. 9A) and the current $I_D$=0. When the gate voltage is increased so that $V_G$>240V, the movable contact makes the electrical connection with the input and output contact (FIG. 9B) and the current, $I_D$ flows from input to the output electrode. The observed current saturation FIG. 8 is due to the maximum source-current limit (Imax=100 mA) of the measuring instrument.

Figure 9A:
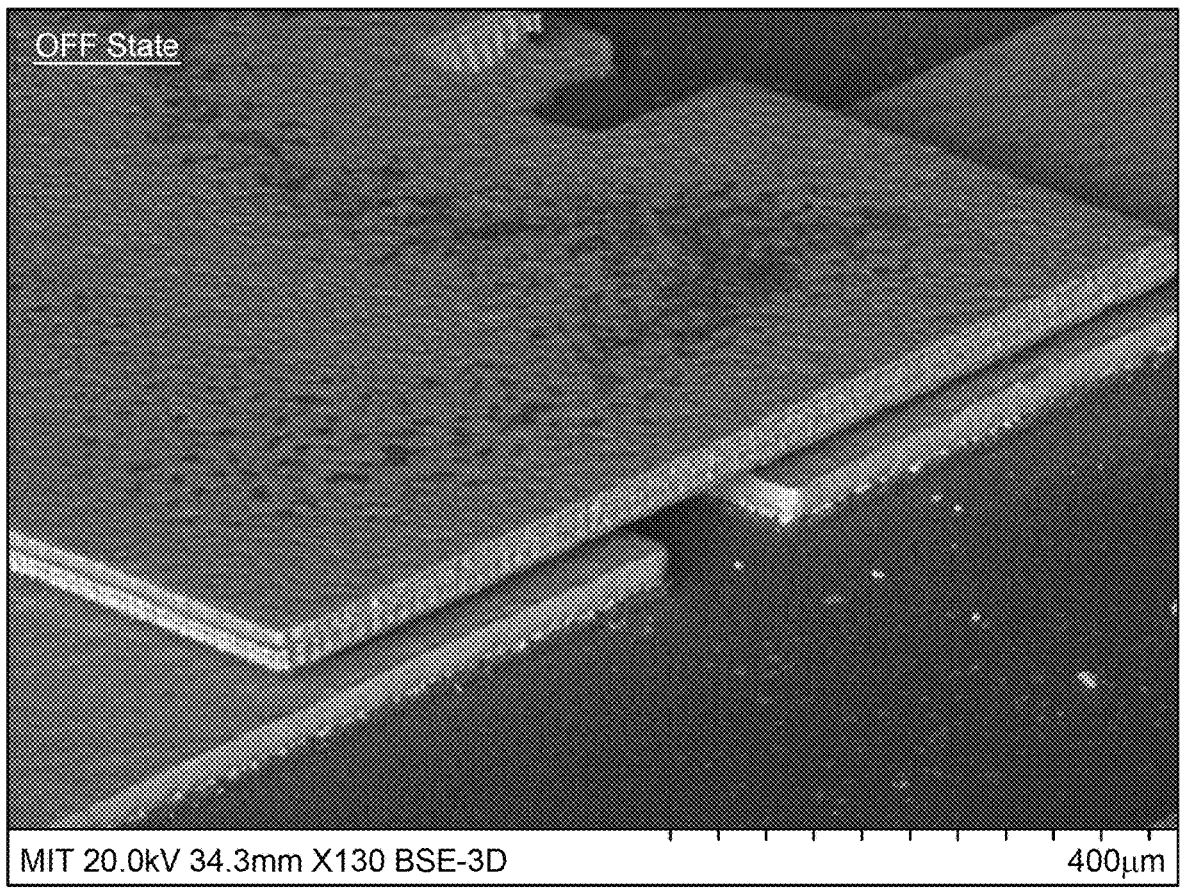
Figure 9B:
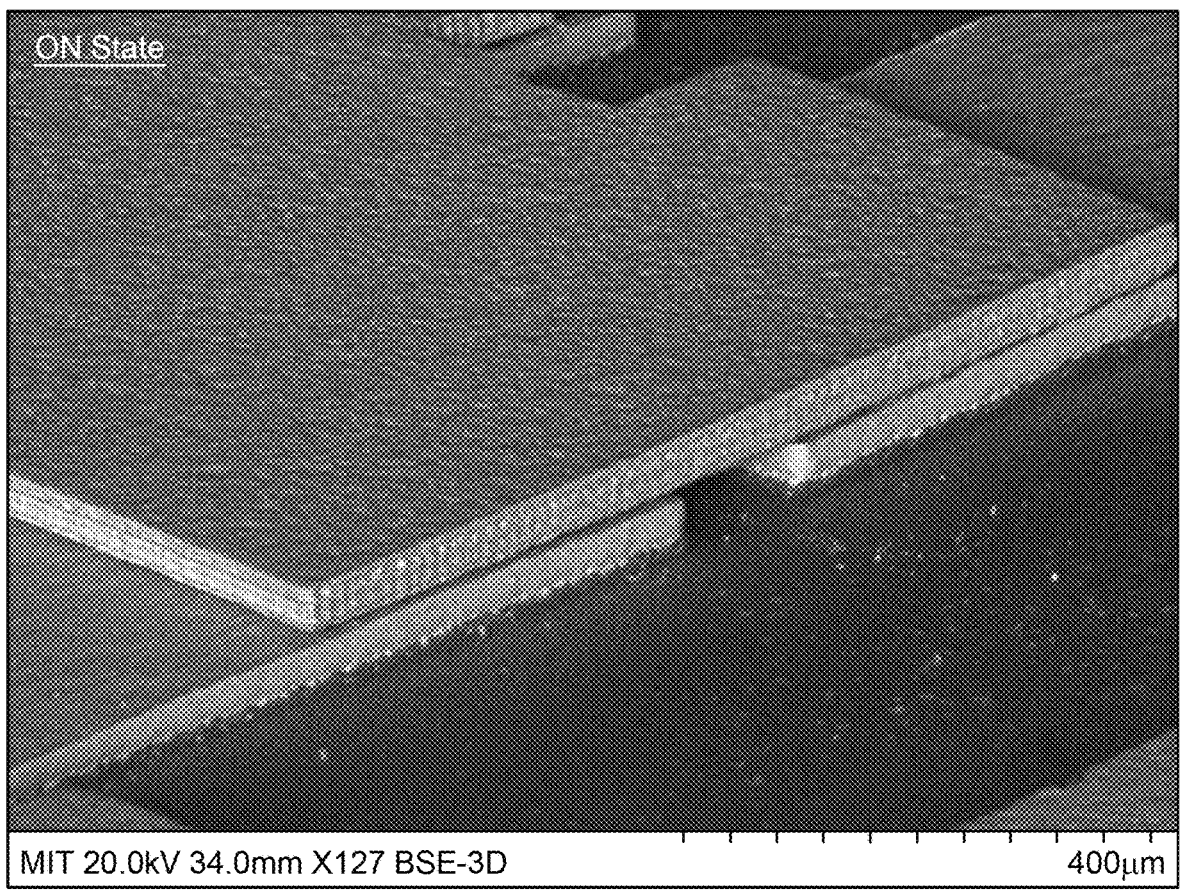

FIGS. 9A-9B are SEM images showing the operation of MEM relay: (A) Small air-gap between the movable contact and input and output contact when the relay is off. and (B) The formation of electrical contact between the movable electrode and input & output contact when the relay is turned on.

Figure 10:
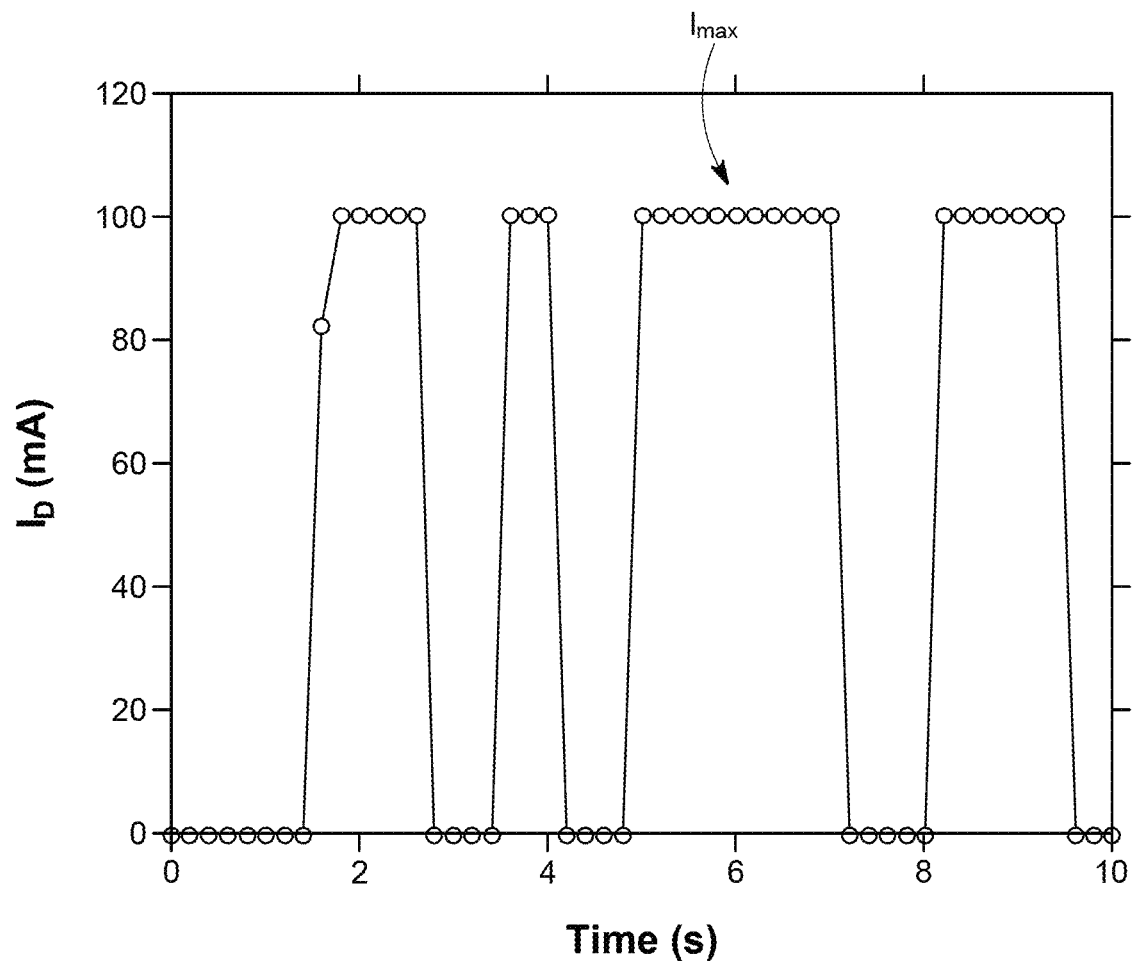
FIG. 10 shows the load current $I_D$ vs. time plot of MEM relay demonstrating current switching. The current $I_D$ is measured by applying a constant voltage $V_{GS}$=10V between the input and output electrode and manually cycling the gate voltage $V_G$=240V on and off.
Figure 11A:
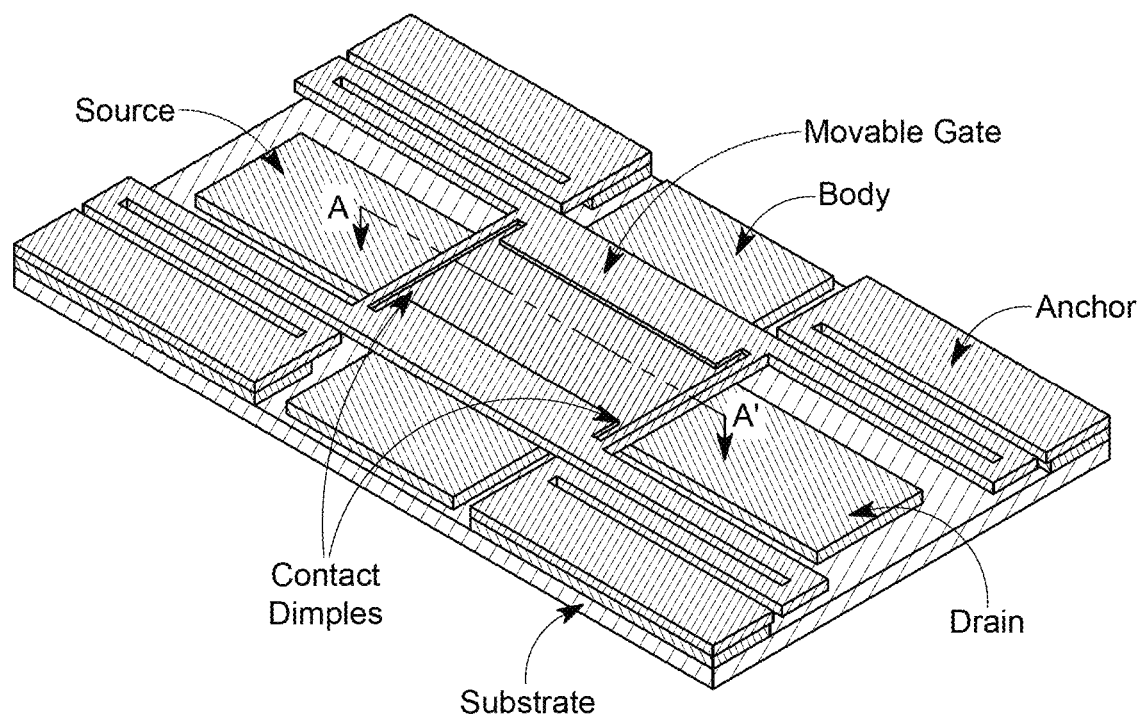
FIG. 11 shows an alternate embodiment of a MEM relay. A serpentine design of the spring is used, and the actuator electrode is anchored from four corners.
Figure 11B:
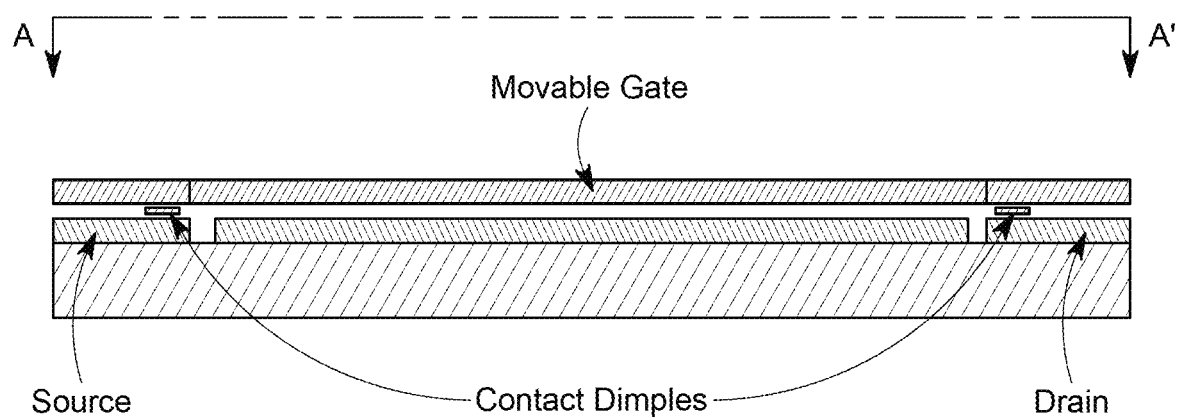
Figure 11C:
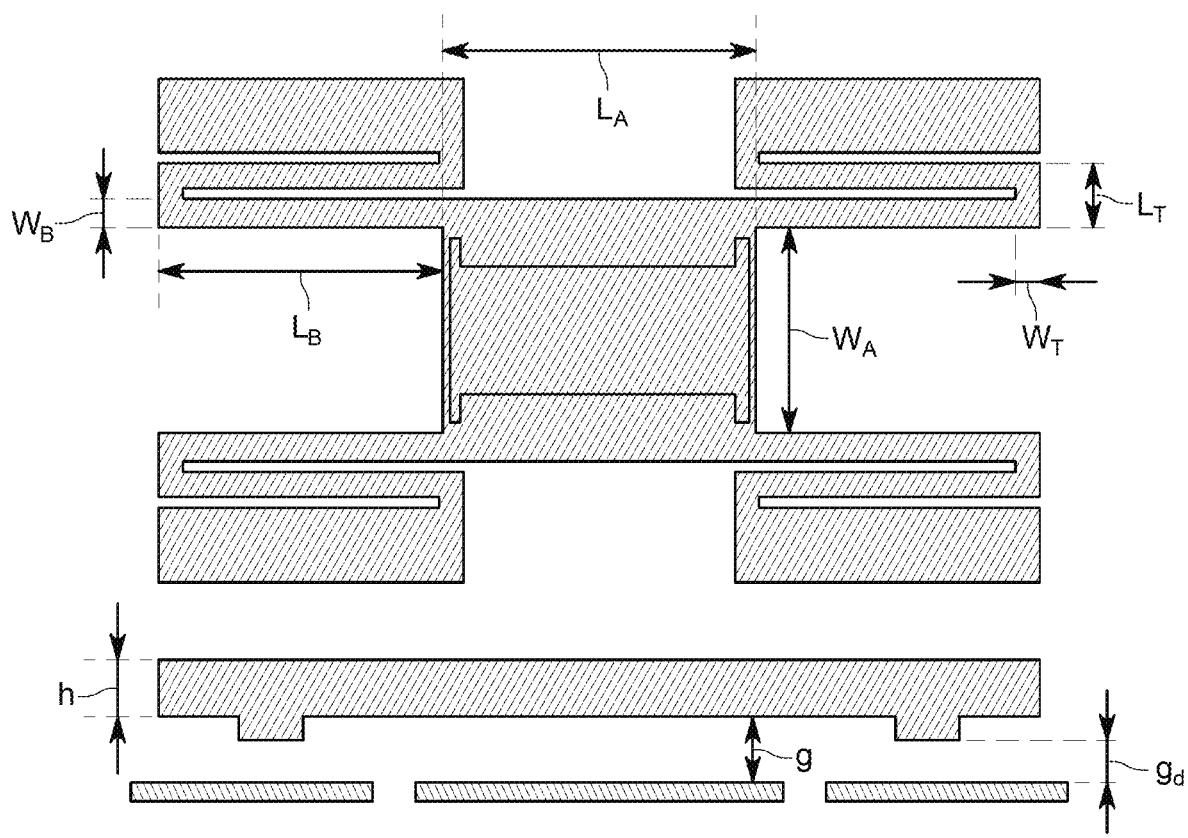
Figure 11D:
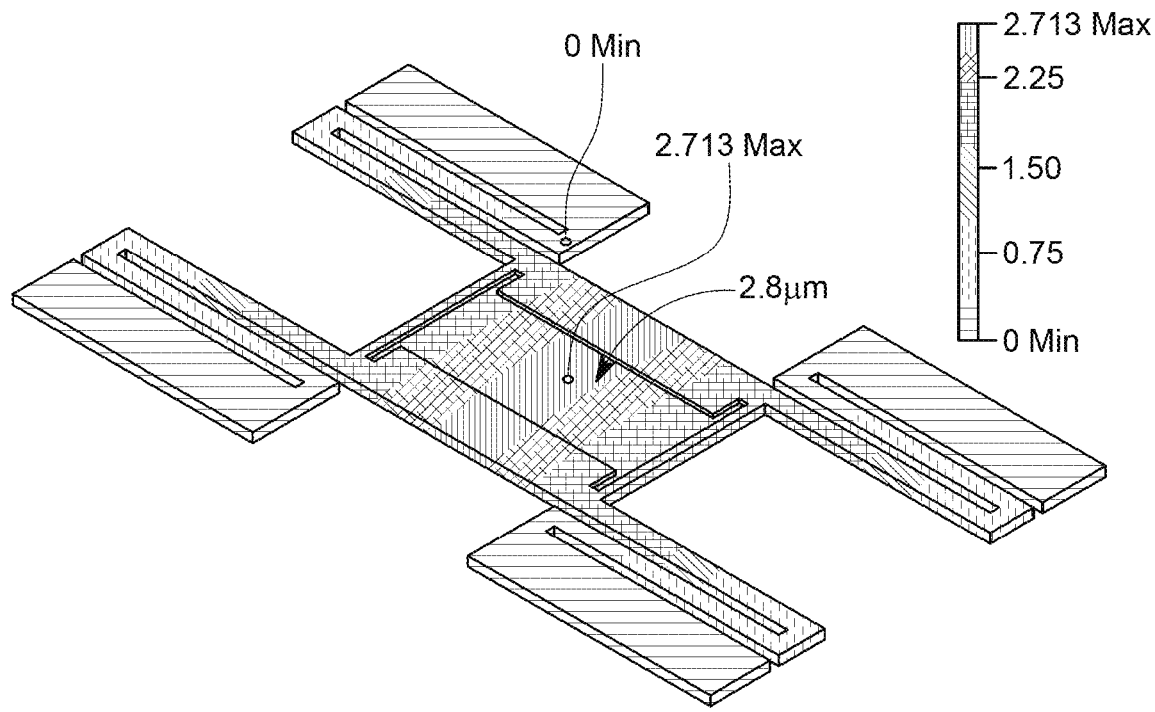

The example of the MEM relay closes at a threshold voltage of approximately 240 volts. To observe the switching action of the relay, a voltage $V_G$=240V is manually applied, and the corresponding current $I_D$ is measured and plotted with respect to time. FIG. 10 shows the current vs. time plot when the relay is turned ON and OFF repeatedly. As stated earlier, the square wave nature of the current profile is due to the limit on the maximum current that can be sourced from the measuring instrument. The $I_D$ is measured by applying a constant voltage $V_{GS}$=10V between the input and output electrode and manually cycling the gate voltage $V_G$=240V on and off.

ALTERNATE EMBODIMENTS

Many embodiments of the relay design are possible and can be fabricated using the MEM relay fabrication process of the present invention. One such design is shown in FIG. 11 where a serpentine design of the spring is used, and the actuator electrode is anchored from four corners. For ultra-thin metal foils, a rigid frame is used to attach the actuator electrode. The substrate layer consists of source and drain electrode (also known as input and output electrode) and body electrode. The body electrode is conformally coated with parylene to provide electrical insulation between the movable gate electrode and body electrode. When a voltage is applied between the movable gate electrode and body electrode, the actuator electrode is pulled down due to electrostatic attraction. The movable gate electrode is pulled down until it makes physical contact with source and drain electrode, thereby completing the electrical connection.

Figure 12:
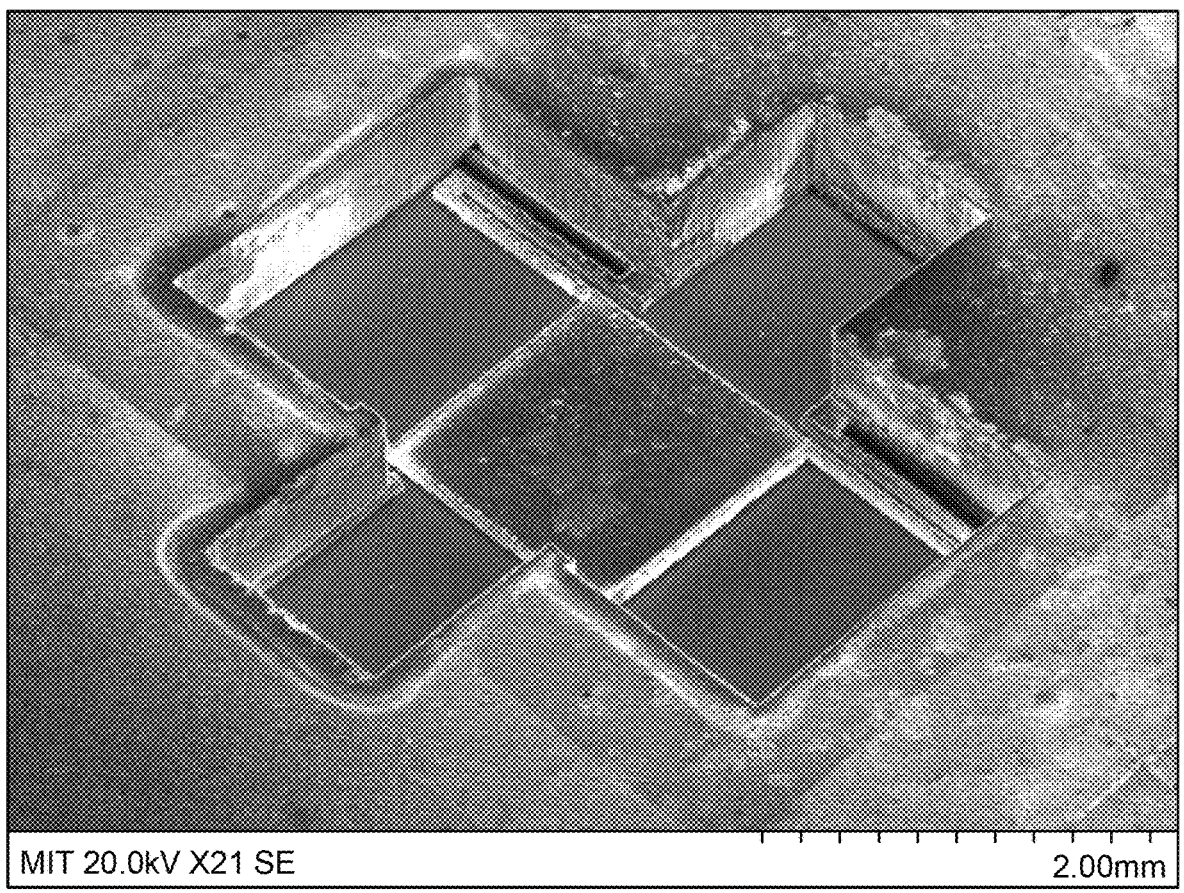
FIG. 12 shows a fabricated MEM relay corresponding to the embodiment shown in FIG. 11.

FIG. 12 shows a SEM photograph of the fabricated MEM relay corresponding to the design shown in FIG. 11. The source, drain, and body electrode of the example of this embodiment are 100 nm thick gold electrodes Several descriptions and illustrations have been presented to aid in understanding the present invention. One with skill in the art will realize that numerous changes and variations may be made without departing from the spirit of the invention. Each of these changes and variations is within the scope of the present invention.

We claim:

1. A micro-electromechanical (MEM) relay comprising:
a movable actuator electrode in the shape of a square attached to a substrate by two straight cantilever beams each extending between the substrate and the movable actuator electrode parallel to opposing sides of the square;
three separated fixed electrodes also attached to the substrate located below the actuator electrode, the three separated fixed electrodes including a gate electrode, an input electrode and an output electrode;
a conductive contact bar attached to the actuator electrode; the contact bar on an opposite side of the square actuator electrode from the side which extends cantilever beams to the substrate, the contact bar electrically isolated from the actuator electrode;
the actuator electrode and the gate electrode constructed such that application of an applied voltage greater than a particular threshold voltage applied between the actuator electrode and the gate electrode causes the actuator electrode to be pulled toward the gate electrode by electrostatic force causing the contact bar to make contact with both the input electrode and the output electrode shorting the input electrode to the output electrode.

2. The MEM relay of claim 1, wherein the two cantilever beams act as springs causing the actuator electrode to separate from the gate electrode when the applied voltage is removed.

3. The MEM relay of claim 1, wherein, the contact bar is electrically isolated from the actuator electrode by a dielectric layer.

4. The MEM relay of claim 3, wherein the dielectric layer is a polyamide and is approximately 12 μm thick.

5. The MEM relay of claim 1, wherein the actuator electrode is approximately 18 μm thick copper sheet.

6. The MEM relay of claim 1, wherein the substrate is a portion of an FR4 copper-clad printed circuit board.

7. The MEM relay of claim 6, wherein the FR4 copper-clad circuit board has a copper layer approximately 35 μm thick, and a support layer approximately 0.7 mm thick.

8. The MEM relay of claim 1, wherein the actuator electrode comprises three separate layers.

9. The MEM relay of claim 8, wherein the three layers include a top layer of approximately 18 μm thick copper sheet; a middle layer of approximately 12 μm thick polyimide; and a bottom layer of approximately 18 μm thick copper, said bottom layer forming the contact bar.

10. The MEM relay of claim 1, wherein the particular threshold voltage is approximately 240 volts.

* * * * *